United States Patent [19]

Van Der Vis

[11] Patent Number: 5,187,488
[45] Date of Patent: Feb. 16, 1993

[54] TUNABLE HIGH-FREQUENCY ANTENNA

[75] Inventor: Pieter A. Van Der Vis, Wassenaar, Netherlands

[73] Assignee: Nederlandse Organisatie Voor Toegepast-Natuurwetenschappelijk Onderzoek Tno, The Hague, Netherlands

[21] Appl. No.: 612,845

[22] Filed: Nov. 14, 1990

[30] Foreign Application Priority Data

Nov. 14, 1989 [NL] Netherlands .......................... 8902812

[51] Int. Cl.$^5$ .............................................. H01Q 9/16
[52] U.S. Cl. .................................... 343/747; 343/801
[58] Field of Search ............... 343/747, 745, 810, 816, 343/890, 793, 801, 802, 812, 813, 814

[56] References Cited

U.S. PATENT DOCUMENTS

| | | | |
|---|---|---|---|
| 1,633,775 | 6/1927 | Esau | 343/893 |
| 3,339,205 | 8/1967 | Smitra | 343/747 |
| 3,716,867 | 2/1973 | Mayes et al. | 343/747 |
| 4,201,990 | 5/1980 | Altmayer | 343/747 |
| 4,486,722 | 12/1984 | Landt | 333/17 M |
| 4,564,843 | 1/1986 | Cooper | 343/745 |
| 4,656,483 | 4/1987 | Jaquet | 343/745 |

FOREIGN PATENT DOCUMENTS

| | | |
|---|---|---|
| 1949556 | 4/1971 | Fed. Rep. of Germany . |
| 56-73904 | 6/1981 | Japan . |
| 2113922 | 8/1983 | United Kingdom . |

OTHER PUBLICATIONS

"Programmable Antenna-tuning Unit and Its Use With Shortwave Transmitter SK 1/39 . . . ", *News From Rohde & Schwartz*, vol. 19, No. 24, 1970, By S. Neumann et al., pp. 21-24.

*Primary Examiner*—Rolf Hille
*Assistant Examiner*—Hoanganh Le
*Attorney, Agent, or Firm*—Young & Thompson

[57] ABSTRACT

Tunable high-frequency antenna which has, over its length dimension, a number of built-in switches by means of which antenna sections are defined and frequency tuning takes place through antenna length matching by disconnecting and connecting said antenna sections. The antenna comprises a pair of parallel wire conductors, incorporated in series with the switches, which form a dipole antenna and which are used both for the high-frequency antenna current conduction and for feeding the switches. The antenna is provided at its central feed point with a control circuit for the frequency tuning. Each switch is formed by a bistable relay with an associated drive circuit which no longer requires power after switching, the disconnected antenna sections with the switches associated thereto being electrically isolated from the remaining part of the antenna after completion of the length matching. The control circuit is so desinged that, in each frequency interval corresponding to a particular antenna length, an impedance matching at a freely selectable number of tuning frequencies is achieved with the aid of a circuit containing reactances.

10 Claims, 3 Drawing Sheets

TUNABLE HIGH-FREQUENCY ANTENNA

BACKGROUND OF THE INVENTION

The invention relates to a tunable high-frequency antenna which has, over its length dimension, a number of built-in switches by means of which antenna sections are defined and frequency matching takes place through antenna length tuning by disconnecting and connecting said antenna sections. Such an antenna is known from the specification DE-1949556.

The antenna specified in said specification is a so-called HELIX antenna in which sections of windings from the helical antenna radiator can be short-circuited by means of switches implemented as reed relays. The antennas usually operate in the UHF/VHF range in which the radiator is self-supporting. The monostable reed relays need a separate drive or feed line which has to be well screened from the antenna. For this purpose, they can be accommodated inside the tubular radiator of the HELIX antenna. The short-circuiting technique used in this case cannot be used for the much longer high-frequency wire antennas, all the more so because every switching component would require a feed line which will strongly couple to the high-frequency wire antenna. A further disadvantage is that a continuous current feed is required for every reed relay switched on.

Such a known antenna can also not be used for many applications, including military ones, for which only antennas composed of thin wires are suitable for reasons of visibility and weight. In the case of such an antenna, the antenna length also has to be matched to the frequency to obtain a good antenna efficiency since the bandwidth of such an antenna having a very large length/thickness ratio is very small with respect to the required frequency range.

SUMMARY OF THE INVENTION

The object of the invention is to eliminate the above-mentioned problems and to provide a high-frequency antenna which can be matched to the frequency to be used in a simple and cost-effective manner.

According to the invention, this is achieved in an antenna of the type mentioned in the preamble in a manner such that the antenna comprises a pair of parallel wire conductors, incorporated in series with the switches, which form a dipole antenna and which are used both for the high-frequency antenna current conduction and for feeding the switches, and in that the antenna is provided at its central feed point with a control circuit for the frequency tuning.

In such a design according to the invention, the antenna length can be matched automatically in a very easy manner to the frequency to be used without manual matching of the length being necessary.

In such a design according to the invention, the length of the antenna sections to be switched is also so chosen that, in the disconnected and isolated state, they do not become resonant at a frequency which is within the frequency range of the antenna. The disconnection and connection is carried out with the aid of bistable relays which require no holding current after switching and therefore no longer require additional electric power.

In the case of a high-frequency antenna of this type, one will attempt to limit the number of switches for a particular desired frequency range to a necessary minimum. Matching of the impedance will then furthermore be necessary for each chosen frequency interval from the frequency range associated with a particular antenna length. Matching networks for this purpose are often composed of a $\pi$- or T-, or $\frac{1}{2}\pi$- or $\frac{1}{2}$T-network respectively of variable coils and capacitors. Such "variometers" are mainly used in short-wave antennas, as known from The ARRL Antenna Book 1964, Library of Congress Catalog Card No. 55-8966. In order to cause the impedance matching to proceed automatically under a command from a control unit, a choice will be made to replace the continuously variable reactances by switchable coil and capacitor banks, respectively, which are constructed in accordance with a binary series. Examples of this are known, for example, from "Programmable antenna tuning unit and its use with shortwave transmitter SK 1/39" by S. H. Neuman et al. in Rohde und Schwarz Mitteilungen, vol. 19, No. 24, 1970, Munich, Germany.

The antenna according to the invention can advantageously be used in a frequency range of up to four octaves in the 1 to 30 MHz band.

BRIEF DESCRIPTION OF THE DRAWINGS

The antenna according to the invention will be explained in greater detail on the basis of an exemplary embodiment, with reference to the drawings, in which.

DESCRIPTION OF THE PREFERRED EMBODIMENTS

Figure 1:
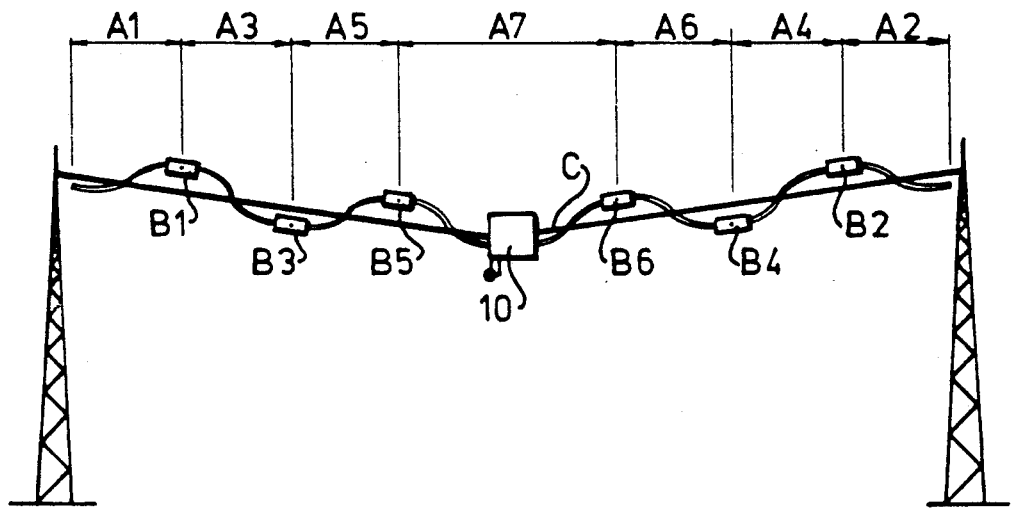
FIG. 1 shows a diagrammatic view of an exemplary embodiment of the antenna according to the invention.

The exemplary embodiment shown in FIG. 1 represents an antenna whose conductor pair, mounted on a nonconducting support C is divided into seven antenna sections. The use, for said support, of material which has a low stretch and a high tensile strength such as, for example, Twaron is of great importance. Such a support may take the form of a long woven cord around which or in which the two wire conductors are wound.

The switches B1-B6 provided in a distributed manner over the length dimension of the conductor pair preferably comprise bistable relays 12, each having an associated decoder drive circuit 11. It is obvious that the antenna may be composed of more antenna sections or fewer. The two parallel wire conductors in one sheath behave in terms of high frequency, i.e. for the high-frequency transmit/receive information and as regards appearance, as one conductor (in terms of high frequency, the two conductors have the same potential), but not in terms of low frequency, i.e. for the control signals of the switches. Antenna sections A can be disconnected and connected from the central feed portion 10 with the aid of the switches B1-B6. This length matching associated with a particular frequency interval may be accompanied by a simultaneous impedance matching by switching a suitable reactance in series for each chosen length at a freely selectable number of frequencies. This takes place in the central portion section 10 of the antenna with the aid of a central control circuit 19.

Figure 5:
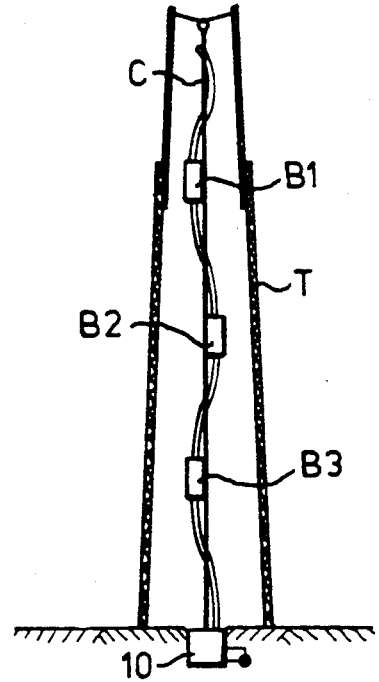
FIG. 5 shows a diagrammatic view of another exemplary embodiment of the antenna according to the invention.

The exemplary embodiment shown in FIG. 1 is a dipole antenna, usually mounted horizontally, which has seven sections A1–A7 of unequal length. The central feed portion 10 is located with slight asymmetry in the center of the dipole antenna. It is, however, also possible that the antenna be implemented as a vertically mounted half-dipole (or monopole) antenna, the other (imaginary) half of which is located in mirrored form in the earth. This is shown in FIG. 5 in which T represents a nonconducting rod support. The central feed portion 10 is in that case located at the lowermost end of the half-dipole antenna.

Figure 3:
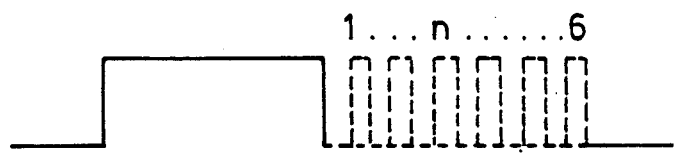
FIG. 3 shows a graph of the pulsed control signal.
Figure 2:
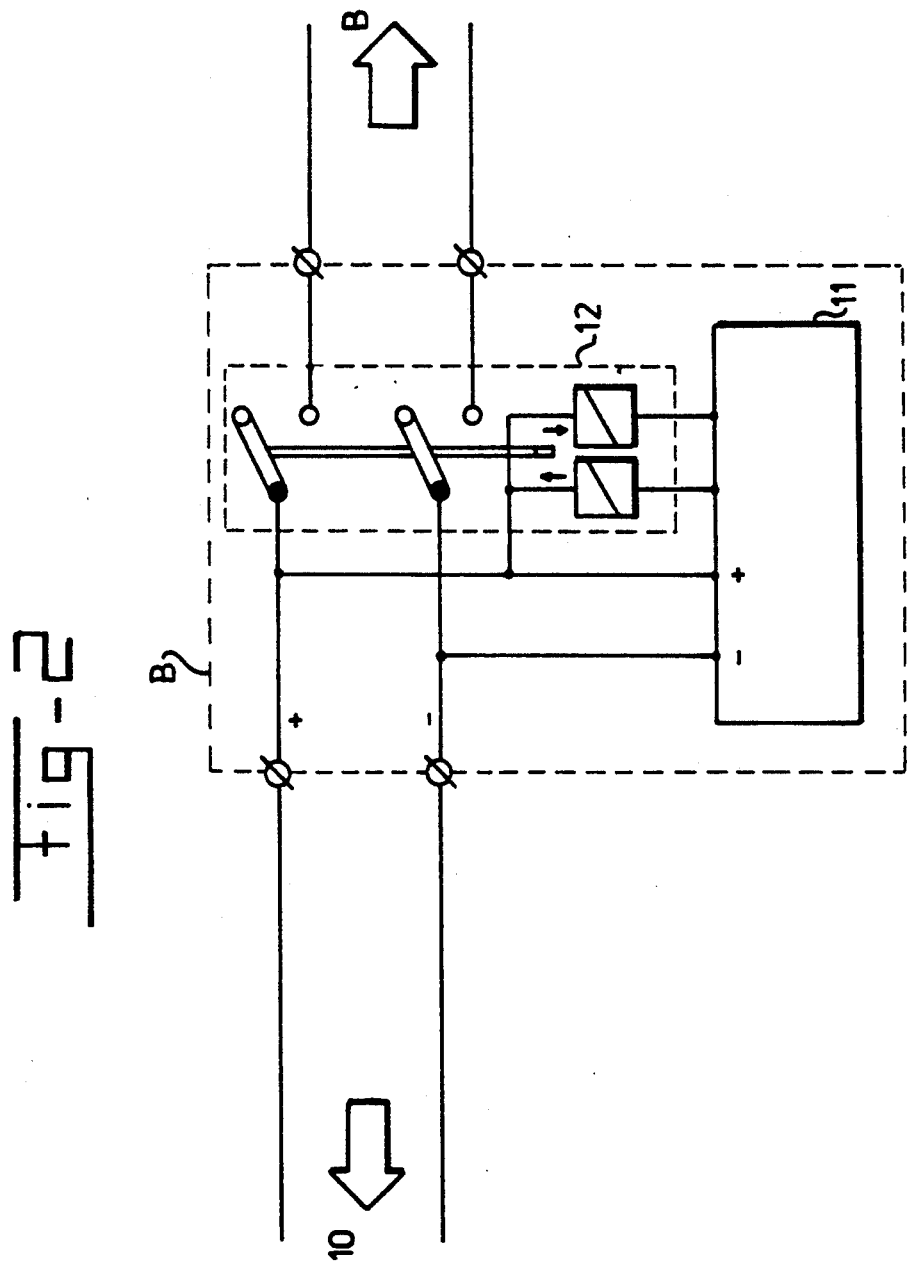
FIG. 2 shows a diagram of the switch incorporated in the connecting point between two consecutive antenna sections.

FIG. 2 gives an example of an antenna switch B between two antenna sections, use being made of a bistable relay 12. The decoder drive circuit 11 is driven by the pulsed signal shown in FIG. 3. The control signal, which is transmitted as a difference voltage to the antenna switch via the conductor pair, comprises a start or strobe pulse followed by a number of pulses equal to the number of antenna switches which have to be switched open. The strobe is a wide direct-voltage pulse which acts as feed for the decoder drive circuits 11 and also represents the command "close relays". This closes all the bistable relays 12 in a sequence which runs from the inside outwards, i.e. from the central feed portion 10 in the direction of the antenna ends. The number of pulses n following the strobe pulse has, as a function of the measured frequency, the result that the contacts of n relays are now opened again in sequence from the outside inwards. Such a tuning operation lasts not more than 100 ms.

Advantageously, the antenna is made suitable for the high-frequency range from 1.6 to 8 MHz, which range is divided into seven (geometrically) equal frequency intervals:

1.60–2.01 MHz
2.01–2.53 MHz
2.53–3.19 MHz
3.19–4.01 MHz
4.01–5.05 MHz
5.05–6.36 MHz
6.36–8.00 MHz

Figure 4:
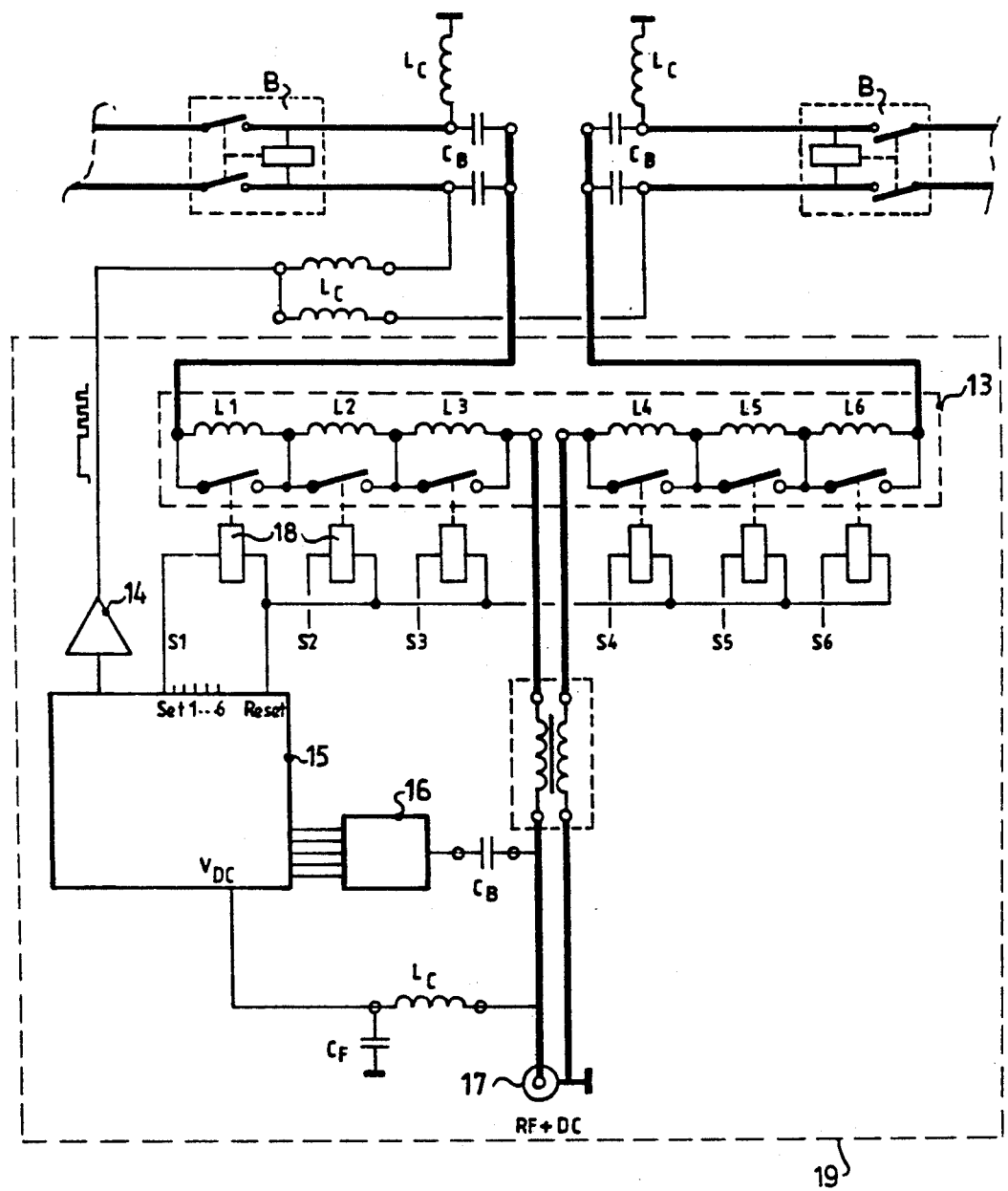
FIG. 4 shows a general diagram of the control circuit incorporated in the central feed point.

The control circuit 19 shown in FIG. 4 and incorporated in the central feed portion 10 contains a frequency meter 16 for measuring the frequency to be transmitted, a microprocessor 15 for controlling the switching operations, an amplifier 14, a series circuit 13 of self-inductances L1 to L6 to be disconnected or connected, each having an associated bistable relay 18, and a connection point 17, for the high-frequency transmit/receive information and the DC feed of the components 14, 15 and 16, situated between antenna and the transmit/receive unit (not shown).

The operation may in this case be such that the signal from the associated transmit/receive unit (not shown) is first fed to the antenna at low power via the connection point 17. After the frequency of this signal has been measured by the frequency meter 16 and then the tuning of the antenna has taken place, the signal is emitted by the transmit/receive unit to the antenna at normal power.

After the automatic frequency measurement mentioned, a control and switching signal is supplied by the microprocessor 15 via the amplifier 14 to the antenna switches B for the purpose of length matching and a control signal is supplied to the bistable relays 18 through which the series of self-inductances L1 to L6 are adjusted for the purpose of impedance matching. The switching signal originating from the amplifier 14 is fed via choke coils $L_C$ to the conductor pair of the antenna. With the aid of this design it is possible to adjust eight tuning frequencies in each of the seven frequency intervals. Because the antenna itself can tune to fifty-six frequencies in the 1.6–8 MHz band, the mutual spacing of the tuning frequencies is 3%. In the most unfavourable case, the tuning error may therefore amount to 1.5%. With the six specified self-inductances L1 to L6, increasing in value by a factor of 2, $2^6=64$ equidistant values are possible. In the exemplary embodiment shown here, the step size is 0.7 $\mu$H and the self-inductance range therefore runs from 0 to 44.1 $\mu$H.

The great advantage of this implementation according to the invention is furthermore that the radiation resistance remains within reasonable limits and that the disconnected or "free-floating" antenna sections remain transparent for all the frequencies. In addition, after completing the length and impedance matching to the new transmit/receive frequency, the disconnected antenna sections are completely, and also electrically, isolated from the remaining operating part of the antenna and no power is required after the tuning operation to maintain this adjustment.

I claim:

1. Tunable high-frequency antenna which has, over its length dimension, a number of built-in switches by means of which antenna sections are defined and frequency tuning takes place through antenna length matching by disconnecting and connecting said antenna sections, characterized in that each antenna section comprises a pair of parallel wire conductors, connected in series with the switches, said switches being double-pole switches, which antenna sections in series form a dipole antenna and which are used both for high-frequency antenna current conduction and for feeding the double-pole switches, and in that the antenna is provided at its central feed point with a control circuit for tuning the frequency.

2. Antenna according to claim 1, wherein the antenna is a horizontal dipole antenna fed approximately in its center, and mounted on a nonconducting support.

3. Antenna according to claim 1, wherein the antenna is a vertical half-dipole antenna fed at its lowermost end, and mounted on a nonconducting support.

4. Antenna according to claim 1, wherein the antenna sections have predetermined lengths, said predetermined lengths preventing antenna sections from becoming resonant in the disconnected state at a frequency which is within the frequency range of the antenna.

5. Antenna according to claim 1, wherein each switch is formed by a bistable relay with an associated drive circuit which no longer requires power after switching, and wherein disconnected antenna sections with the switches associated thereto are electrically isolated from a remaining part of the antenna after completion of the length matching.

6. Antenna according to claim 5, wherein switch control signals from the control circuit, comprise a wide strobe pulse which causes all relays to close and a subsequent number of pulses which is equal to the number of relays which have to be opened, are generated in the central feed point.

7. Antenna according to claim 1, wherein the antenna length dimension is divided by means of (n−1) switches into n antenna sections and the frequency range is thereby divided into n frequency intervals.

8. Antenna according to claim 1, wherein the control circuit is arranged and designed so that, in each frequency interval corresponding to a particular antenna length, an impedance matching at a freely selectable number of tuning frequencies is achieved with the aid of a circuit containing reactances.

9. Antenna according to claim 1, operable with a high-frequency transmit/receive unit, in which the frequency to be used is adjusted and wherein the control circuit is provided with a frequency meter in order to measure the frequency of the high-frequency signal to be transmitted and in order to subsequently activate the length and impedance matching of the antenna therefrom.

10. Antenna according to claim 1, wherein the frequency range of the antenna comprises four octaves in the 1 to 30 MHz band.

* * * * *